(12) United States Patent
Hsieh et al.

(10) Patent No.: US 10,553,563 B2
(45) Date of Patent: Feb. 4, 2020

(54) ELECTRONIC DEVICE

(71) Applicant: EPISTAR CORPORATION, Hsinchu (TW)

(72) Inventors: Min-Hsun Hsieh, Hsinchu (TW); Jai-Tai Kuo, Hsinchu (TW); Chang-Hsieh Wu, Hsinchu (TW); Tzu-Hsiang Wang, Hsinchu (TW); Chi-Chih Pu, Hsinchu (TW); Ya-Wen Lin, Hsinchu (TW); Pei-Yu Li, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/993,102

(22) Filed: May 30, 2018

(65) Prior Publication Data

US 2019/0371764 A1    Dec. 5, 2019

(51) Int. Cl.
*H01L 23/52* (2006.01)
*H01L 25/065* (2006.01)

(52) U.S. Cl.
CPC ........... *H01L 25/0657* (2013.01); *H01L 2225/06555* (2013.01); *H01L 2225/06579* (2013.01); *H01L 2225/06582* (2013.01); *H01L 2225/06589* (2013.01)

(58) Field of Classification Search
CPC . H01L 21/4353; H01L 24/81; H01L 25/0657; H01L 25/115; H01L 25/117

USPC ........................................................ 257/735
See application file for complete search history.

(56) References Cited

U.S. PATENT DOCUMENTS

| | | | | |
|---|---|---|---|---|
| 5,994,166 | A * | 11/1999 | Akram | H05K 1/144 257/686 |
| 7,049,692 | B2 * | 5/2006 | Nishimura | H01L 23/3128 257/686 |
| 7,087,988 | B2 * | 8/2006 | Hosomi | H01L 25/0657 257/686 |
| 7,242,081 | B1 * | 7/2007 | Lee | H01L 25/0657 257/686 |
| 7,248,482 | B2 * | 7/2007 | Asahi | H01L 25/165 257/E25.031 |
| 7,294,928 | B2 * | 11/2007 | Bang | H01L 23/49816 257/685 |
| 7,843,059 | B2 * | 11/2010 | Gomyo | H01L 23/3128 257/686 |
| 8,148,806 | B2 * | 4/2012 | Lin | H01L 25/0657 257/202 |
| 8,203,214 | B2 | 6/2012 | Bathan | |
| 8,559,184 | B2 * | 10/2013 | Takaike | H01L 23/5383 361/761 |
| 2011/0176280 | A1 | 7/2011 | Lee | |
| 2013/0214425 | A1 | 8/2013 | Marais | |

\* cited by examiner

*Primary Examiner* — Luan C Thai
(74) *Attorney, Agent, or Firm* — Muncy, Geissler, Olds & Lowe, P.C.

(57) ABSTRACT

An electronic device includes a top carrier having a first top surface and a first bottom surface, a first electronic element formed on the first top surface, a second electronic element formed on the first bottom surface, a bottom carrier below the top carrier and having a second top surface near the top carrier, and a controller formed on the second top surface.

20 Claims, 5 Drawing Sheets

Top View

Bottom View

Top View

Bottom View

ELECTRONIC DEVICE

TECHNICAL FIELD

The present disclosure relates to an electronic device having electronic components arranged on stacked carriers without bonding wires, and more particularly to an electronic device.

DESCRIPTION OF THE RELATED ART

An electronic device applied in a system of high power consumption has numerous electronic elements formed within the electronic device. The electronic elements in the electronic device are usually formed by wire bonding. However, the more bonding wires formed within the electronic device induce more parasitic capacitances which deteriorate the stability and consumes more power. Thus, how to form an electronic device applied for a high power consumption system without influence of bonding wires is an important issue.

SUMMARY OF THE DISCLOSURE

The following description illustrates embodiments and together with drawings to provide a further understanding of the disclosure described above.

An electronic device includes a first carrier having a top surface and a bottom surface, a first electronic element formed on the top surface, a second electronic element formed on the bottom surface, a second carrier below the first carrier and having a first surface near the first carrier, and a controller formed on the first surface.

An electronic device includes a first carrier having a top surface and a bottom surface, a first electronic element formed on the top surface, a second electronic element flip-chip bonded on the bottom surface, and a second carrier below the first carrier.

An electronic device includes a first carrier having a top surface and a bottom surface, a switch formed on the top surface, a current source formed on the bottom surface, a second carrier below the first carrier and having a first surface near the first carrier and a controller formed on the first surface.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed.

Figure 1A:
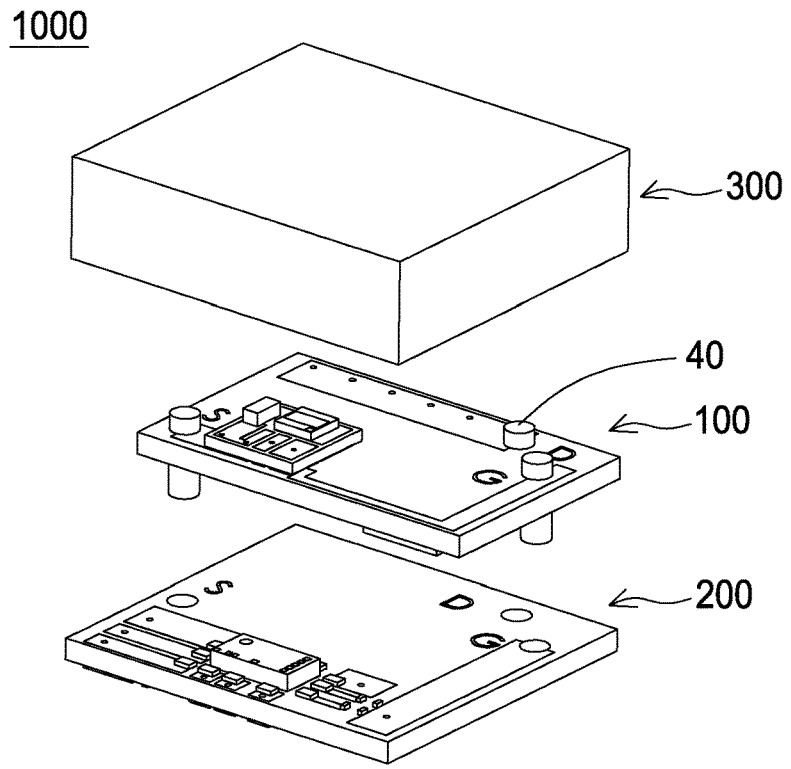
FIG. 1A shows an exploded view and a perspective view of an electronic device in accordance with an embodiment of the present disclosure.
Figure 1A:
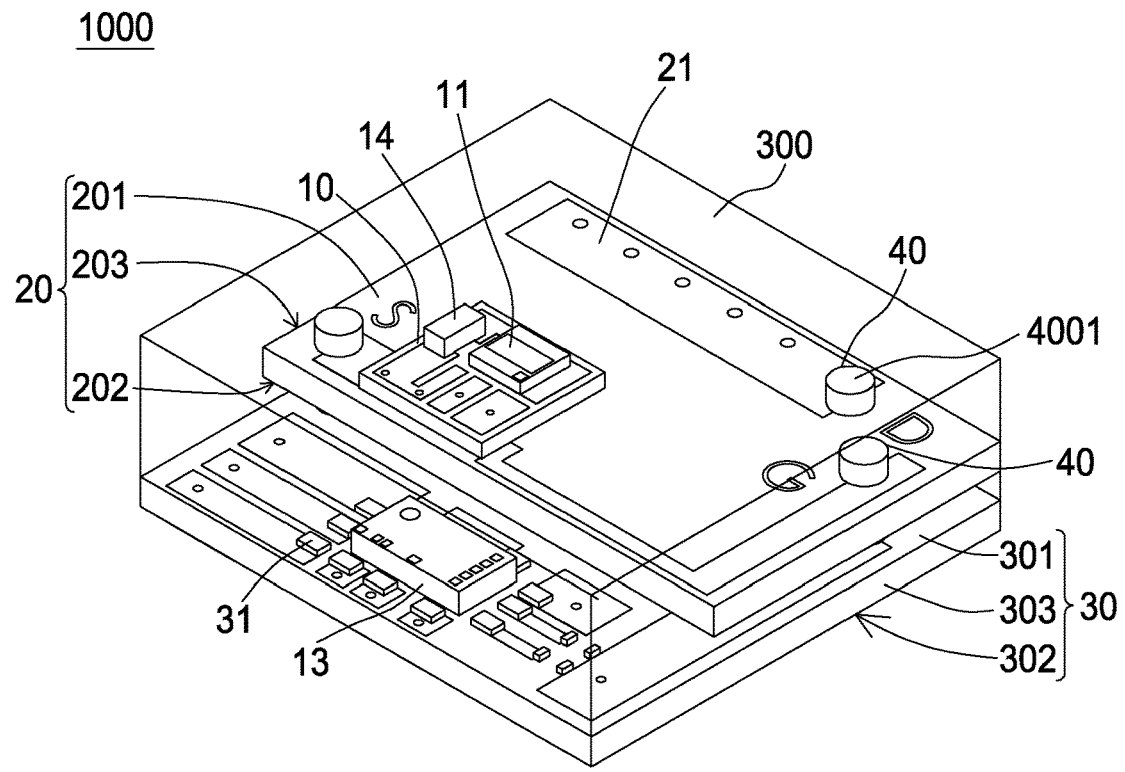

FIG. 1A shows an exploded view and a perspective view of an electronic device in accordance with an embodiment of the present disclosure. Referring to the upper part of FIG. 1A, an electronic device 1000 includes an encapsulation layer 300, a top portion 100, a bottom portion 200 and pillars 40. Referring to the lower part of FIG. 1A, the electronic device 1000 has a carrier 10, a top carrier 20, electronic elements 11, 14, a first top electrode layer 21, a first bottom electrode layer (not shown), a bottom carrier 30, an controller 13, a second top electrode layer 31 and a second bottom electrode layer (not shown). It is noted, the encapsulation layer 300 is opaque. The controller 13 can be an integrated chip (IC). In an embodiment, the controller 13 provides signals for controlling other elements or devices. The elements in the lower part of FIG. 1A encapsulated by the encapsulation layer 300 are consisted of continuous lines as shown in FIG. 1A for convenience of understanding. The pillars 40 penetrate the top portion 100 and electrically connect the top portion 100 and the bottom portion 200. The top carrier 20 has a first top surface 201, a first bottom surface 202, and a first side surface 203 between the first top surface 201 and the first bottom surface 202. The bottom carrier 30 has a second top surface 301, a second bottom surface 302, and a second side surface 303 between the second top surface 301 and the second bottom surface 302. The first bottom surface 202 is arranged between the first top surface 201 and the second top surface 301. The encapsulation layer 300 covers the top portion 100, the bottom portion 200 and the pillars 40. To be more specific, the encapsulation layer 300 is directly connected to the first top surface 201, the first side surface 203, and the top surface 301. The encapsulation layer 300 is not physically connected to the second side surface 303. The second bottom surface 302 is not directly connected to the encapsulation layer 300. In an embodiment, a portion of the encapsulation layer 300 is arranged between the first bottom surface 202 and the second top surface 301. The encapsulation layer 300 is a molding compound. The material of the encapsulation layer 300 can be epoxy, resin, moldable polymer, or the like. In an embodiment, the material of the encapsulation layer 300 can be an ultraviolet (UV) cured polymer, a thermally cured polymer, a thermoplastic material, a potting material or a thermally cured resin applied in a form of gel or malleable solid, and then be cured through a UV or thermal curing process. In an embodiment, the encapsulation layer 300 may be cured with a mold (not shown). In an embodiment, the encapsulation layer 300 includes $SiO_2$ or $SiN_x$.

The top portion 100 is overlapped with the bottom portion 200. The top portion 100 has a projection on the bottom portion 200, and the projection area is smaller than the area of the bottom portion 200. The pillars 40 are formed at positions near the corners of the top portion 100. The pillars 40 provide connection between the top portion 100 and the bottom portion 200 in the electronic device 1000 and provide electrical conductive path between the top portion 100 and the bottom portion 200. Moreover, the pillars 40 also enhance the structural strength of the electronic device 1000. Referring to FIG. 1A, one of the pillars 40 has a top end 4001 above the top surface 201 and a bottom end 4002 (not shown) exposed from the bottom surface 302. In an embodiment, the electronic device 1000 has a first encapsulation layer covering the top portion 100 and the bottom portion 200 and a second encapsulation layer entirely arranged between the top portion 100 and the bottom portion 200.

Figure 1B:
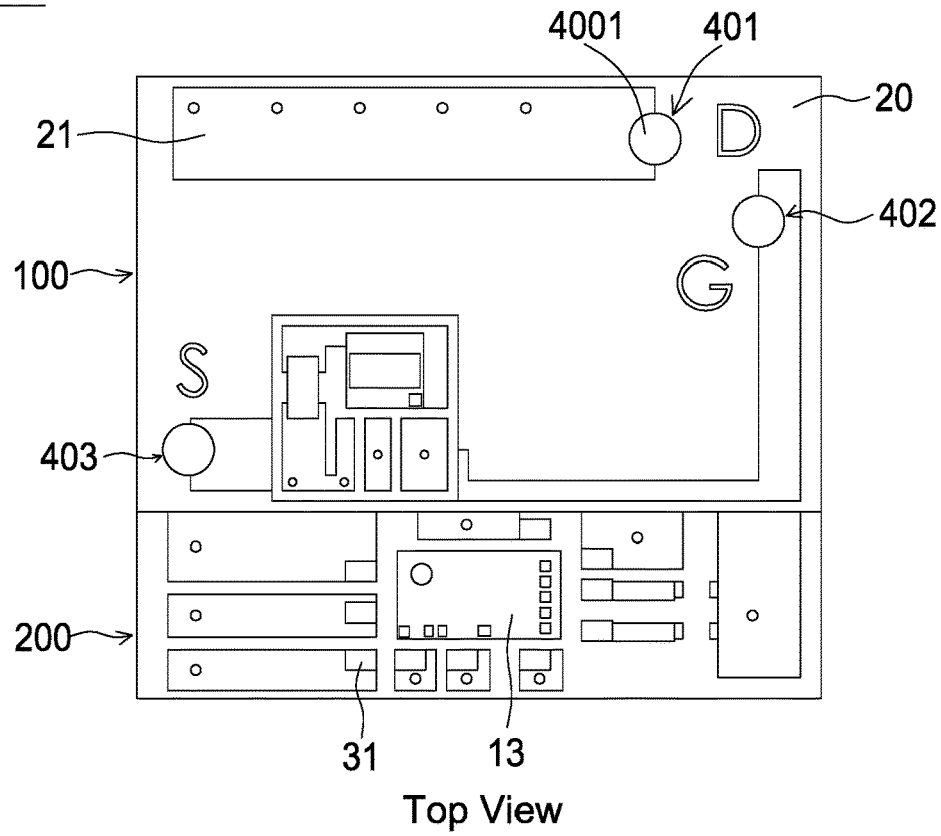
FIG. 1B shows a top view and a bottom view in accordance with an embodiment shown in FIG. 1A.
Figure 1B:
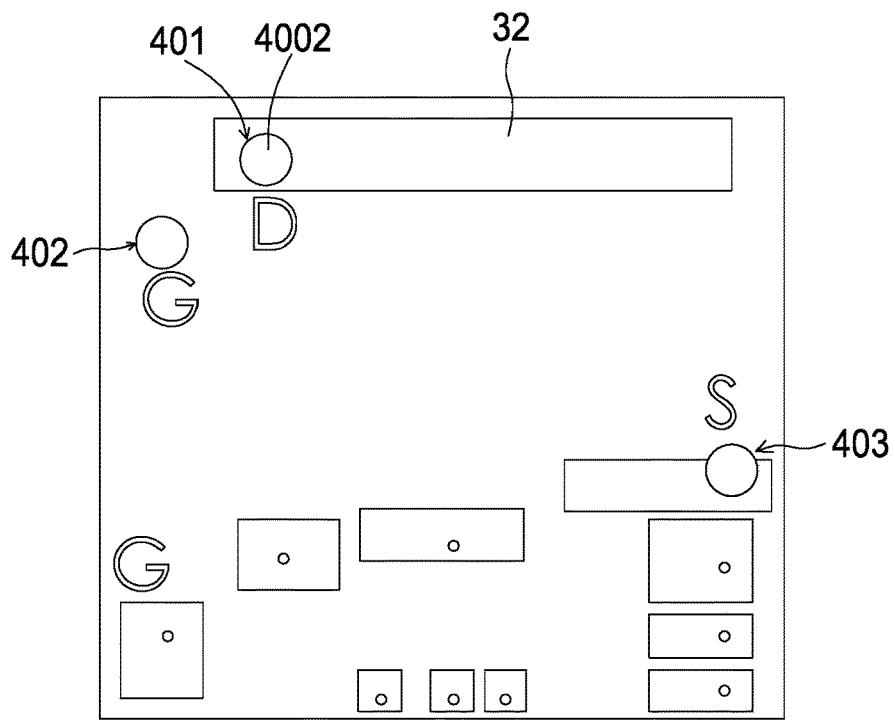

FIG. 1B shows a top view and a bottom view in accordance with an embodiment shown in FIG. 1A. Referring to the top view in FIG. 1B, the top portion 100 is fully overlapped with the bottom portion 200, and at least a portion of the bottom portion 200 is not covered by the top portion 100. The controller 13 is exposed without being covered by the top portion 100. The pillars 401, 402, 403 are located near edges of the electronic device 1000. The pillars 401, 402, 403 penetrate the top portion 100 and the bottom portion 200. As shown in FIG. 1B, the pillar 401 has a top end 4001 and a bottom end 4002. Referring to the top view, the top end 4001 is exposed from the top portion 100 in the top view. Referring to the bottom view, the bottom end 4002 is exposed from the bottom portion 200. The pillars 401, 402, 403 are electrically connected to the first top electrode layer 21 of the top portion 100, the second top electrode layer 31 of the bottom portion 200, and the second bottom electrode layer 32 of the bottom portion 200. To be more specific, the pillar 401/402/403 includes conductive materials and has a conductive side end (not shown) between the top end 4001 and the bottom end 4002. The conductive side end is directly connected to the first top electrode layer 21 and the second bottom electrode layer 32. In an embodiment, the top end 4001 and the bottom end 4002 can be conductive. In an embodiment, the pillars 401, 402, 403 include conductive metal, such as copper, gold and/or silver.

Figure 2A:
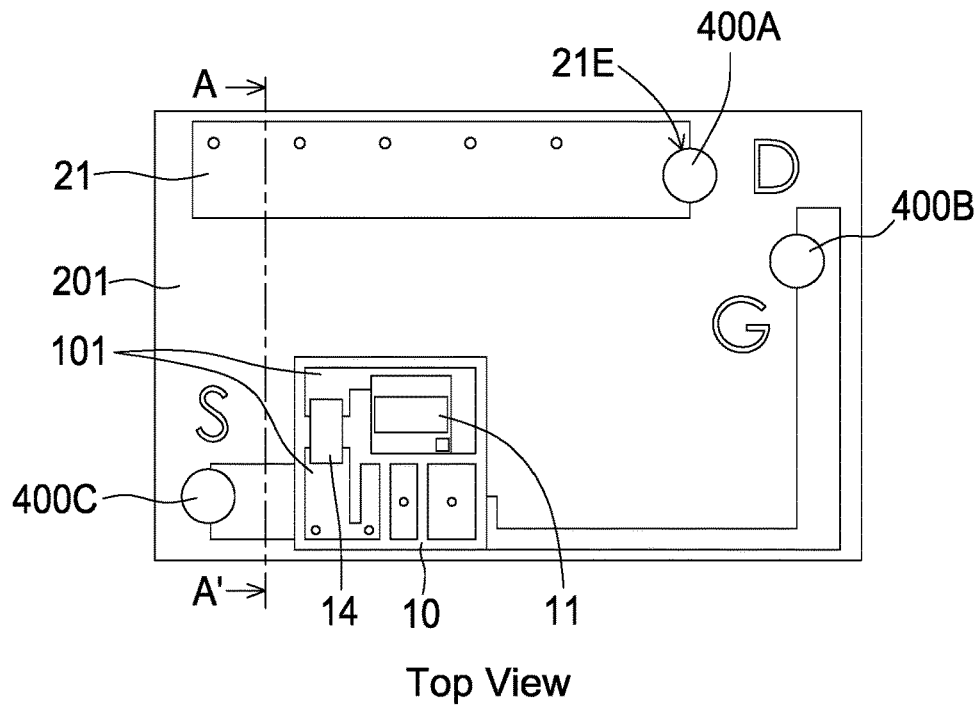
FIG. 2A shows a top view and a bottom view of the top portion in FIG. 1A.
Figure 2A:
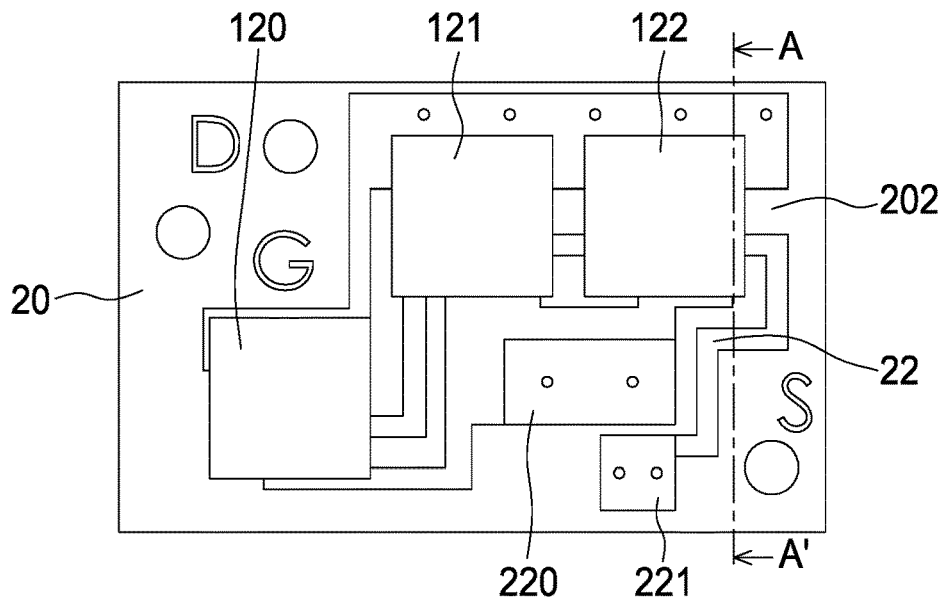

FIG. 2A shows a top view and a bottom view of the top portion in FIG. 1A. Referring to FIG. 2A, the upper part shows the top view and the lower part shows the bottom view. The top portion 100 includes a carrier 10, a top carrier 20, electronic elements 11, 120, 121, 122, 14, a first top electrode layer 21, a metal layer 101 and a first bottom electrode layer 22. The metal layer 101 has a first portion between the carrier 10 and the electronic elements 11, 14 and a second portion within the top carrier 10. The electronic elements 11, 14 are electrically connected with the first top electrode layer 21 by the metal layer 101. Referring to the top view, the electronic elements 11, 14 are formed on a carrier 10. In an embodiment, the material of the first top electrode layer 21 and a first bottom electrode layer 22 can be Au, Cu, Ti, Ni, Al, Pt, alloy thereof, or a combination thereof. The electronic element 11 can be used as a switch, such as an enhancement mode transistor or an enhancement mode MOSFET (metal-oxide-semiconductor field-effect transistor). In an embodiment, the electronic element 14 is a passive electronic element, such as a resistor. The through holes 400A-400C are arranged near edges of the top carrier 20. The through holes 400A-400C are provided for inserting pillars 401~403 shown in FIG. 1B. The pillars 401~403 shown in FIG. 1B are physically connected to the top portion 100. To be more specific, the pillars 401~403 shown in FIG. 1B are physically connected to the top carrier 20 and the first top electrode layer 21, especially physically connected to a side surface (connecting the first top surface 201 and the first bottom surface 202) within the top carrier 20 and an edge of the first top electrode layer 21. The pillars 401~403 shown in FIG. 1B are electrically connected to the electronic elements 11, 120, 121, 122, 14, the first top electrode layer 21 and the first bottom electrode layer 22.

The carrier 10 is formed on the first top surface 201 of the top carrier 20. The carrier 10 is electrically connected to the top carrier 20. The carrier 10 is electrically connected to the top carrier 20 through an electrically conductive paste, such as a solder or an anisotropic conductive film. The electronic elements 11, 14 are electrically connected to the first top electrode layer 21. Referring to the bottom view in the lower part of FIG. 2A, the electronic elements 120, 121, 122 are formed on the first bottom surface 202 of the top carrier 20. The electronic elements 120, 121, 122 are electrically connected to the first bottom electrode layer 22. Furthermore, the electronic elements 120, 121, 122 are electrically connected to the electronic elements 11, 14 sequentially through the first bottom electrode layer 22, the metal layer (not shown) within the top carrier 20, the first top electrode layer 21 and the metal layer 101 of the carrier 10. In an embodiment, the electronic elements 120, 121, 122 are transistors, such as gallium nitride (GaN) based HEMTs (High-electron-mobility transistors). To be more specific, the electronic elements 120, 121, 122 are depletion mode transistors which are operated in a normally on mode. Thus, the electronic elements 120, 121, 122 have negative threshold voltage. The first bottom electrode layer 22 further includes heat dissipation portions 220 and 221 to enhance the heat dissipation of the electronic elements 11 and 14. The carrier 10 is formed on an edge of the top carrier 20 while the electronic elements 120, 121, 122 are substantially formed on an opposite edge of the carrier. In other words, the electronic elements 120, 121, 122 are not overlapped with the electronic elements 11 and 14. In an embodiment, a heat dissipation layer is formed between the electronic element 11 and the carrier 10. The heat dissipation layer is not overlapped with the electronic elements 120, 121, 122. The electronic elements 120, 121, 122 are arranged based on the requirement of the electronic device 100. For example, three electronic elements 120, 121, 122 are arranged for higher output application while one element 120 is arranged for lower output application. To be more specific, one electronic device with only one electronic element, such as the electronic element 120, is arranged to provide maximum current output of 10 mA, and another electronic device with three electronic elements, such as the electronic element 120, 121, 122, is arranged to provide maximum current output of 30 mA. In an embodiment, the maximum current output of the electronic elements 120, 121, 122 are different. In an embodiment, the electronic elements 120, 121, 122 are designed to provide different amount of current.

In an embodiment, the electronic element 11, 120, 121, 122 includes a substrate suitable for epitaxial growth, such as sapphire ($Al_2O_3$), silicon carbide (SiC), or silicon (Si). In an embodiment, the substrate is made of silicon (Si) and has a thickness ranged between 200 and 400 μm, for example 300 μm. The electronic element 120, 121, 122 can be made of gallium nitride (GaN), MN, AlGaN, $Al_yIn_zGa_{(1-z)}N$ (0<y<1, 0<z<1), or etc. In an embodiment, the electronic element 120, 121, 122 includes GaN and aluminum gallium nitride ($Al_xGa_{(1-x)}N$), x=0.05~1. The material of the electronic element 120, 121, 122 can be selected from AlGaN/InGaN/GaN, AlN/GaN, AlN/InGaN/GaN, AlGaAs/GaAs, AlGaAs/InGaAs, InAlAs/InGaAs, and InGaP/GaAs. The electronic element 120, 121, 122 has a thickness of a range 150~300 nm, for example 200 nm.

Figure 2B:
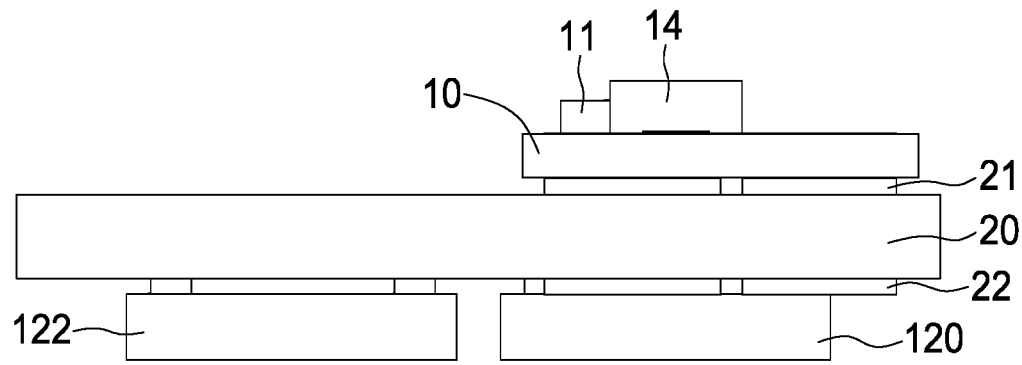
FIG. 2B shows a cross-sectional view of the top portion along the line AA' in FIG. 2A.

FIG. 2B shows a cross-sectional view of the top portion 100 along the line AA' in FIG. 2A. Referring to FIG. 2B, the electronic element 120 is overlapped with the electronic elements 11 and 14. The electronic element 122 and the electronic element 120 are arranged on different sides for convenience of arranging multiple devices on one surface. In an embodiment, the electronic element 121 and the electronic element 120 are arranged with respect to an imaginary central line passing through a geometrical center of the top carrier 20 in a direction parallel with the longer edge of the top portion 100. The electronic element 122 is not overlapped with the electronic elements 11 and 14. In an embodiment, no electronic element is arranged below the electronic elements 11 and 14, and the heat generated by the electronic elements 11 and 14 while operating can be easily dissipated to the air. To be more specific, the first bottom surface 202 is vacated at the position corresponding to the electronic elements 11 and 14 to reach a better heat dissipation performance. Referring to FIGS. 2A-2B, the electronic elements 11, 14, 120, 121, 122 are arranged on the carrier without being connected to a wire. To be more specific, the electronic elements 120, 121, 122 are flip-chip mounted on the top carrier 20, and the electronic elements 11, 14 are flip-chip mounted on the carrier 10.

Figure 2C:
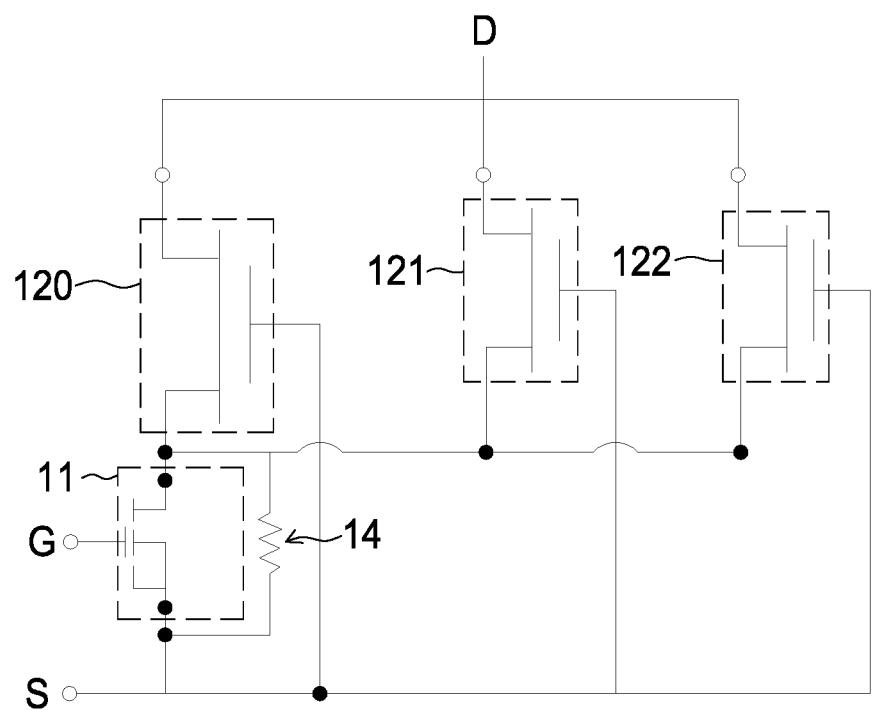
FIG. 2C shows an equivalent circuit in accordance with the top portion shown in FIG. 2A.

FIG. 2C shows an equivalent circuit in accordance with the top portion 100 shown in FIG. 2A. To be more specific, FIG. 2C shows the equivalent circuit of the electronic elements 11, 14, 120, 121 and 122. Referring to FIG. 2C, the electronic elements 120, 121 and 122 are functioned as current sources. The electronic element 11 is provided as a switch to control the electronic elements 120, 121 and 122. The electronic element 14 is provided for controlling the voltage between the drain end and the source end of the electronic element 11, and for tuning the output current of the circuit. In an embodiment, the electronic elements 121 and 122 are not provided, and the electronic element 11 is provided to control the electronic element 120. The combination of the electronic elements 11, 14, 120, 121 and 122 is used as an enhancement mode cascode power switch which is operated in a normally off mode. In an embodiment, the combination of the electronic elements can be used as an enhancement mode transistor which is also operated in a normally off mode. To be more specific, the gate end and the source end of the enhancement mode cascode power switch are respectively corresponding to the gate end and the source end of the electronic elements 11, and the drain end of the enhance mode cascode power switch is corresponded to the drain ends of the electronic elements 120,121 and 122. Furthermore, the enhancement mode cascode power switch can be operated to turn on/off through receiving a control signal from the gate end (of the electronic elements 11). The control signal can be provided by the controller 13.

Figure 3A:
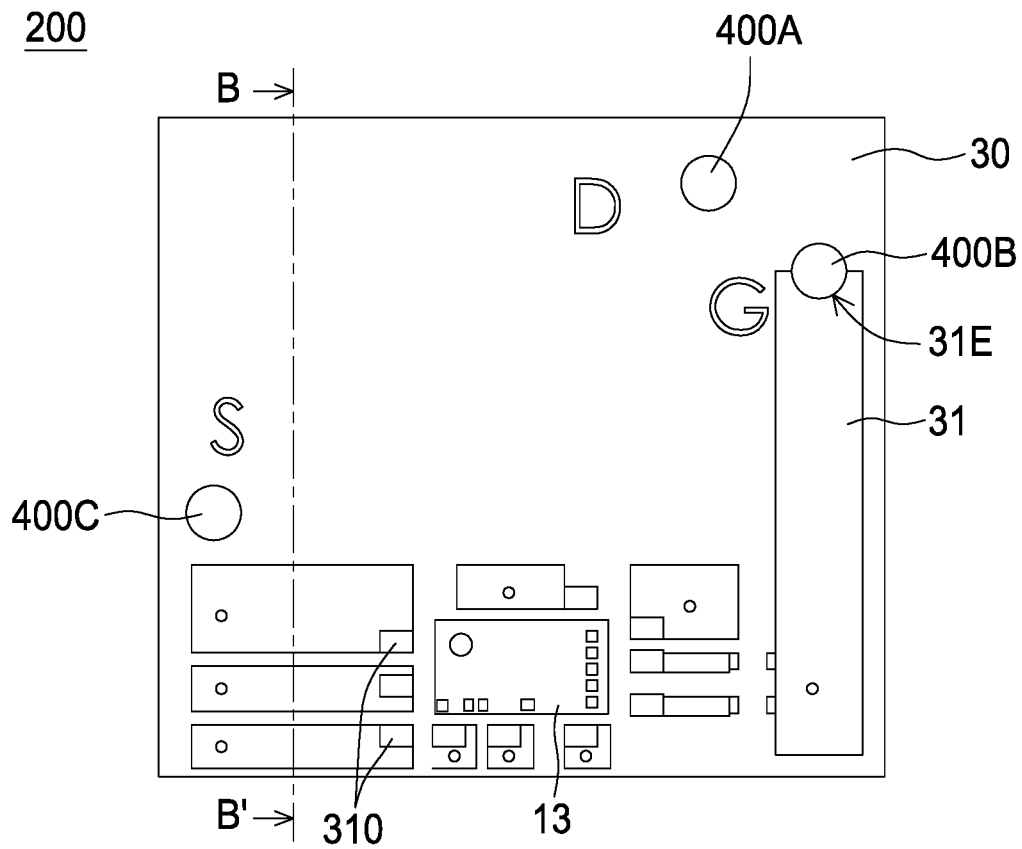
FIG. 3A shows a top view of the bottom portion in FIG. 1A.
Figure 3B:
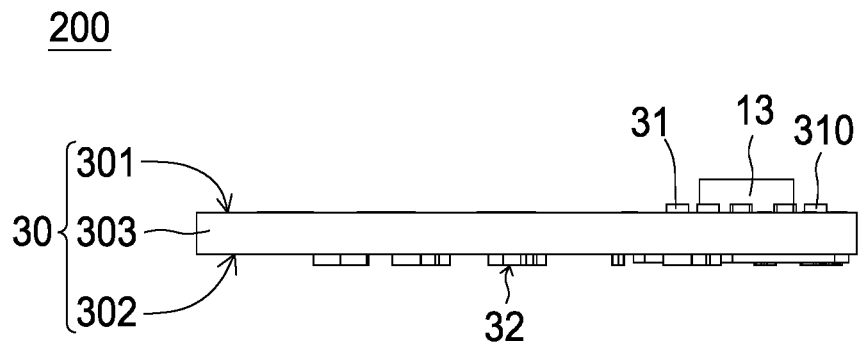
FIG. 3B shows a cross-sectional view of the bottom portion along the line BB' shown in FIG. 3A.

FIG. 3A shows a top view of the bottom portion 200 in FIG. 1A. FIG. 3B shows a cross-sectional view of the bottom portion 200 along the line BB' in FIG. 3A. The bottom view of the bottom portion 200 is identical to the bottom view of the electronic device 1000 as shown in FIG. 1B. The bottom portion 200 includes a bottom carrier 30, a controller 13, a second top electrode layer 31 and a second bottom electrode layer 32. Referring to FIG. 3A, the controller 13 is arranged on the second top electrode layer 31. In an embodiment, the material of the second top electrode layer 31 and a second bottom electrode layer 32 can be Au, Cu, Ti, Ni, Al, Pt, alloy thereof, or a combination thereof. The through holes 400A-400C are arranged near edges of the bottom carrier 30. The through holes 400A-400C are provided for inserting pillars 401~403 shown in FIG. 1B. The pillars 401~403 shown in FIG. 1B are physically connected to the bottom portion 200. To be more specific, the pillars 401~403 shown in FIG. 1B are physically connected to the bottom carrier 30 and the second top electrode layer 31, especially physically connected to a side surface (connecting the second top surface 301 and the second bottom surface 302) within the bottom carrier 30 and an edge of the second top electrode layer 31. The pillars (not shown) are electrically connected to the controller 13, the second top electrode layer 31 and the second bottom electrode layer 32. The pillars (not shown) are electrically connected to the top portion 100 and elements within. Therefore, the elements within the bottom portion 200 can be electrically connected to the element within the top portion 100 through the pillars. For example, the electronic element 11 is electrically connected to the controller 13 through the pillars.

The controller 13 is electrically connected to the second bottom electrode layer 32 sequentially through the second top electrode layer 31, the metal layer (not shown) within the bottom carrier 30. The external power or instruction signal can be transmitted to the controller 13 through the second bottom electrode layer 32. The controller 13 is provided as a controller for controlling the electronic elements 11, 120, 121, 122 according to the instruction signal. As shown in FIG. 3A, the second top electrode layer 31 has an exposed portion 310. In an embodiment, the exposed portion 310 is electrically connected to the controller 13 through bonding wires. In an embodiment, the exposed portion 310 is electrically connected to the controller 13 through the metal layer (not shown) within the bottom carrier 30, and the exposed portion 310 is used to detect the external instruction signal or signals from the controller 13. Referring to FIG. 3B, the controller 13 is arranged on the second top electrode layer 31 and the exposed portion 310 is located on the right side of the controller 13. The controller 13 is arranged on the carrier without connecting to a wire. To be more specific, the controller 13 is flip-chip mounted on the bottom carrier 30.

A portion of the second bottom electrode layer 32 is overlapped with the controller 13. In an embodiment, the controller 13 includes a substrate suitable for epitaxial growth, such as sapphire ($Al_2O_3$), silicon carbide (SiC), or silicon (Si). In an embodiment, the substrate is made of silicon (Si) and has a thickness of a range 200~400 μm, for example 300 μm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. An electronic device, comprising:
   a topmost carrier comprising a first top surface and a first bottom surface;
   a first electronic element formed on the first top surface;
   a first electrode layer arranged on the first top surface;
   a second electronic element formed on the first bottom surface;
   a bottommost carrier arranged below the topmost carrier and having a second top surface facing the topmost carrier, and a second bottom surface opposite to the second top surface;
   a second electrode layer formed on the second bottom surface;
   a controller formed on the second top surface; and
   a pillar connected to the first electrode layer, the topmost carrier and the bottommost carrier, and having a first surface, a second surface and a side surface between the first surface and the second surface; and
   an encapsulation layer arranged on the first to surface and directly connected to the first electronic element and the first surface, wherein the first electrode layer is not covered by the first electronic element, wherein the first surface and the side surface are exposed on the first top surface, and wherein the second surface is exposed on the second bottom surface.

2. The electronic device according to claim 1, wherein the first electronic element comprises a silicon based material.

3. The electronic device according to claim 1, wherein the second electronic element comprises a gallium based material.

4. The electronic device according to claim 1, wherein the pillar is electrically connected to the first electronic element and the controller.

5. The electronic device according to claim 1, wherein the encapsulation layer has a portion arranged between the topmost carrier and the bottommost carrier.

6. An electronic device, comprising:
a topmost carrier comprising a first top surface and a first bottom surface;
a first electronic element formed on the first top surface;
a second electronic element flip-chip bonded on the first bottom surface;
a bottommost carrier arranged below the topmost carrier;
a pillar connected to the topmost carrier and the bottommost carrier, and having a first surface, a second surface and a side surface; and
an encapsulation layer arranged on the topmost carrier, and directly connected to the first electronic element, the first surface and the side surface,
wherein the first surface and the side surface are exposed on the first top surface.

7. The electronic device according to claim 6, further comprising a controller formed on the bottommost carrier.

8. The electronic device according to claim 7, wherein the controller is not covered by the topmost carrier.

9. An electronic device, comprising:
a topmost carrier comprising a first top surface and a first bottom surface;
a switch formed on the first top surface;
a current source formed on the first bottom surface;
a bottommost carrier arranged below the topmost carrier, and having a second top surface facing the topmost carrier, and a second bottom surface opposite to the second top surface;
an electrode layer arranged on the second bottom surface;
a controller formed on the second top surface to control the switch; and
an encapsulation layer arranged on the first top surface and the second top surface; and
a pillar connected to the topmost carrier and the bottommost carrier, and having a first surface, a second surface and a side surface between the first surface and the second surface,
wherein the first surface and the side surface are exposed on the first top surface,
wherein the second surface is exposed on the second bottom surface.

10. The electronic device according to claim 9, wherein the current source comprises a heterojunction structure.

11. The electronic device according to claim 9, further comprising a heat dissipation layer arranged below the switch without overlapping the current source.

12. The electronic device according to claim 9, wherein the current source has a negative threshold voltage.

13. The electronic device according to claim 9, wherein the pillar penetrates the topmost carrier and is physically connected to the bottommost carrier.

14. The electronic device according to claim 1, wherein the encapsulation layer is directly connected to the side surface.

15. The electronic device according to claim 1, wherein the second electrode layer is electrically connected to the pillar.

16. The electronic device according to claim 1, further comprising a heat dissipation layer arranged on the first bottom surface.

17. The electronic device according to claim 6, wherein the bottommost carrier has a second top surface facing the topmost carrier, and a second bottom surface opposite to the second top surface.

18. The electronic device according to claim 9, wherein the electrode layer is electrically connected to the pillar.

19. The electronic device according to claim 9, wherein the encapsulation layer is directly connected to the first surface and the side surface.

20. The electronic device according to claim 17, further comprising an electrode layer arranged on the second bottom surface.

* * * * *